(12) United States Patent
Lin

(10) Patent No.: US 9,653,500 B2
(45) Date of Patent: May 16, 2017

(54) OPTICAL COVER PLATE WITH IMPROVED SOLDER MASK DAM ON GLASS FOR IMAGE SENSOR PACKAGE AND FABRICATION METHOD THEREOF

(75) Inventor: Chia-Sheng Lin, Taoyuan County (TW)

(73) Assignee: XINTEC INC., Taoyuan (TW)

( * ) Notice: Subject to any disclaimer, the term of this patent is extended or adjusted under 35 U.S.C. 154(b) by 1124 days.

(21) Appl. No.: 13/053,209

(22) Filed: Mar. 22, 2011

(65) Prior Publication Data

US 2011/0228390 A1 Sep. 22, 2011

Related U.S. Application Data

(60) Provisional application No. 61/315,991, filed on Mar. 22, 2010.

(51) Int. Cl.
*H01L 33/00* (2010.01)
*H01L 27/146* (2006.01)
(Continued)

(52) U.S. Cl.
CPC ...... *H01L 27/14618* (2013.01); *H01L 23/481* (2013.01); *H01L 27/14687* (2013.01); *H01L 24/05* (2013.01); *H01L 24/13* (2013.01); *H01L 2224/02372* (2013.01); *H01L 2224/0401* (2013.01); *H01L 2224/05548* (2013.01); *H01L 2224/05567* (2013.01); *H01L 2224/131* (2013.01); *H01L 2224/13022* (2013.01);
(Continued)

(58) Field of Classification Search
CPC . H01L 2224/48227; H01L 2224/73265; H01L 27/14618; H01L 2924/00; H01L 2924/00014; H01L 2224/32225; H01L 2924/00012; H01L 31/0203; H01L 27/14625; H01L 2224/94; H01L 2224/131; H01L 2924/0002; H01L 2224/03; H01L 2224/05552; H01L 2224/11; H01L 2924/014; H01L 2224/02372; H01L 2224/0401; H01L 2224/05548; H01L 2224/05567; H01L 2224/13022; H01L 23/481; H01L 24/05; H01L 24/13; H01L 27/14687
USPC .......................................................... 257/98
See application file for complete search history.

(56) References Cited

U.S. PATENT DOCUMENTS 5,907,151 A * 5/1999 Gramann ............ H01L 31/0203
250/214.1
6,874,910 B2 * 4/2005 Sugimoto ........... H01L 25/0753
257/98
(Continued)

FOREIGN PATENT DOCUMENTS

CN 1476065 2/2004
CN 101038926 9/2007
(Continued)

*Primary Examiner* — Duy T Nguyen
(74) *Attorney, Agent, or Firm* — Liu & Liu

(57) ABSTRACT

An optical cover plate for image sensor package includes a transparent substrate, at least an annular dam structure, and a barrier layer. The annular dam structure is disposed on the transparent substrate and encompasses a light-receiving area. The barrier layer conformally covers at least a sidewall of the annular dam structure. A method of manufacturing the optical cover plate, an image sensor package and fabrication method thereof are also disclosed.

24 Claims, 19 Drawing Sheets

(51) Int. Cl.
*H01L 23/48* (2006.01)
*H01L 23/00* (2006.01)
(52) U.S. Cl.
CPC *H01L 2224/13024* (2013.01); *H01L 2224/94* (2013.01); *H01L 2924/0002* (2013.01)

(56) References Cited

U.S. PATENT DOCUMENTS

| | | | |
|---|---|---|---|
| 6,881,980 B1* | 4/2005 | Ting | H01L 33/56 257/100 |
| 7,541,658 B2* | 6/2009 | Kinsman | 257/433 |
| 2005/0105878 A1* | 5/2005 | Wu | B82Y 20/00 385/147 |
| 2005/0173811 A1* | 8/2005 | Kinsman | H01L 24/97 257/784 |
| 2006/0186430 A1* | 8/2006 | Park | H01L 33/641 257/100 |
| 2007/0210400 A1* | 9/2007 | Moribayashi et al. | 257/440 |
| 2009/0039455 A1* | 2/2009 | Chien et al. | 257/433 |
| 2009/0152658 A1* | 6/2009 | Bolken | H01L 27/14618 257/432 |
| 2009/0166785 A1 | 7/2009 | Camacho et al. | |
| 2009/0289319 A1* | 11/2009 | Sakamoto | 257/434 |
| 2010/0051982 A1* | 3/2010 | Lin | H01L 33/486 257/98 |
| 2010/0084694 A1* | 4/2010 | Kim | 257/292 |
| 2010/0200898 A1* | 8/2010 | Lin et al. | 257/294 |

FOREIGN PATENT DOCUMENTS

| | | |
|---|---|---|
| TW | 200908306 | 2/2009 |
| TW | 201044567 | 12/2010 |

\* cited by examiner

OPTICAL COVER PLATE WITH IMPROVED SOLDER MASK DAM ON GLASS FOR IMAGE SENSOR PACKAGE AND FABRICATION METHOD THEREOF

CROSS REFERENCE TO RELATED APPLICATIONS

This application claims the priority from U.S. provisional application No. 61/315,991 filed Mar. 22, 2010.

BACKGROUND OF THE INVENTION

1. Field of the Invention

The present invention relates generally to image sensor packaging. More particularly, the present invention relates to an optical cover plate for image sensor wafer level package and fabrication method thereof. The invention optical cover plate includes an improved dam structure. Further, the invention provides an image sensor package using the same and fabrication method thereof.

2. Description of the Prior Art

With the development and popularity of electronic products such as digital cameras, mobile phones, personal computers and scanners, the image sensor devices have been widely used in various fields. The commonly used solid-state image sensor devices can be generally categorized into two types: charge-coupled device (CCD) and CMOS image sensor. As known in the art, the CMOS image sensors are compatible with semiconductor manufacturing process to achieve low-cost manufacturing. The CMOS image sensors also provide advantages such as small size, low-voltage, low power consumption.

Basically, a CMOS image sensor device is comprised of an optical cover plate and an image sensor die. The optical cover plate comprises a transparent body and a dam structure, wherein light can pass the transparent body. The dam structure is typically formed on an inner side of the transparent body facing the image sensor die. The dam functions as a spacer to maintain a space between the transparent body and the image sensor die. The dam structure, the transparent body and the image sensor die together constitute a cavity to protect the image sensing area on the image sensor die. After incident light passes the transparent and reaches the image sensing area, it can be effectively converted into digital signal.

However, the aforementioned prior art package structure, when used in different circumstances, is subject to peeling. The peeling typically occurs at the interface between the dam structure and the image sensor die and/or the interface between the dam structure and the transparent body because of humidity, stress even the effects of temperature, thereby affecting the reliability of component packaging. In addition, during the back-end stress test such as high accelerated stress test (HAST), temperature-humidity storage test (THS) or other reliability tests, it has been found that the dam structure itself may absorb moisture, resulting in high tensile stressed component packaging, which reduce production yields. Further, the color of the dam structure is usually green, there would be image color cast (slightly greenish) issue, which reduces the image quality. From this, the prior art still has technical issues which need further improvement.

SUMMARY OF THE INVENTION

It is therefore one objective of the invention to provide an improved optical cover plate and image sensor package using the same in order to solve the above-described prior art problems and shortcomings.

It is another objective of the invention to provide an improved optical cover plate and image sensor package using the same with high reliability and improved quality of image signal conversion.

It is still another objective of the invention to provide a method for fabricating an improved optical cover plate and image sensor package using the same in order to provide high reliability and improved quality of image signal conversion.

To address these and other objects and in view of its purposes, the present invention provides an optical cover plate for packaging comprising a transparent substrate; at least one annular dam structure disposed on the transparent substrate, wherein the annular dam structure encompasses a light-receiving region; and a barrier layer conformally covers a sidewall of the annular dam structure.

According to one embodiment, the annular dam structure is composed of epoxy resins, polyimide, photoresist or silicon-based materials. The transparent substrate comprises glass or quartz. The barrier layer may be a metal layer such as aluminum, aluminum nitride, titanium, titanium nitride, tantalum, tantalum nitride, tungsten, titanium tungsten alloys, silver, gold, or any combination thereof. The barrier layer may be a non-metal layer such as silicon oxide, silicon nitride, silicon oxynitride, silicon carbide, or any combination thereof. The barrier layer prevents moisture from entering the light-receiving region and removes color cast that stems from green color of the annular dam structure.

According to another embodiment, the barrier layer extends to a top surface of the annular dam structure. In addition, a supporting pattern may be disposed on the top surface of the annular dam structure. Further, in still another embodiment, the barrier layer extends to the transparent substrate and covers perimeter of the light-receiving region.

According to another aspect, the invention provides an optical cover plate for packaging comprising a transparent substrate; a first dam structure disposed on the transparent substrate, wherein the first dam structure comprises a first top surface and two opposite first sidewalls; a second dam structure disposed on the transparent substrate, wherein the second dam structure comprises a second top surface and two opposite second sidewalls; a dicing region between the first dam structure and the second dam structure; and a barrier layer conformally covers the two opposite first sidewalls of the first dam structure, the transparent substrate within the dicing region, and the two opposite second sidewalls of the second dam structure.

According to one embodiment, the first and second dam structure may be composed of epoxy resins, polyimide, photoresist or silicon-based materials. The transparent substrate comprises glass or quartz. The barrier layer may be a metal layer such as aluminum, aluminum nitride, titanium, titanium nitride, tantalum, tantalum nitride, tungsten, titanium tungsten alloys, silver, gold, or any combination thereof. The barrier layer may be a non-metal layer such as silicon oxide, silicon nitride, silicon oxynitride, silicon carbide, or any combination thereof.

According to another embodiment, the barrier layer extends to the first or second top surface of the first or second dam structure. In addition, a supporting pattern may be disposed on the first or second top surface of the first or second dam structure. Further, in still another embodiment, the barrier layer extends to the transparent substrate and covers perimeter of the light-receiving region.

To sum up, the invention image sensor package and the inventive optical cover plate incorporate a barrier layer on the dam structure, which is capable of resolving color cast problem that stems from the nature and color of the dam structure itself. More importantly, the barrier layer also covers the perimeter of the light-receiving region. By providing such configuration, moisture can be prevented form entering the light-receiving region by way of the annular dam structure. The barrier layer also improves the bonding interface between the annular dam structure and the transparent substrate, the bond pad or the semiconductor substrate. The invention also resolves the peeling problem due to temperature or thermal stress. The invention also provides a method for fabricating the image sensor package and the inventive optical cover plate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
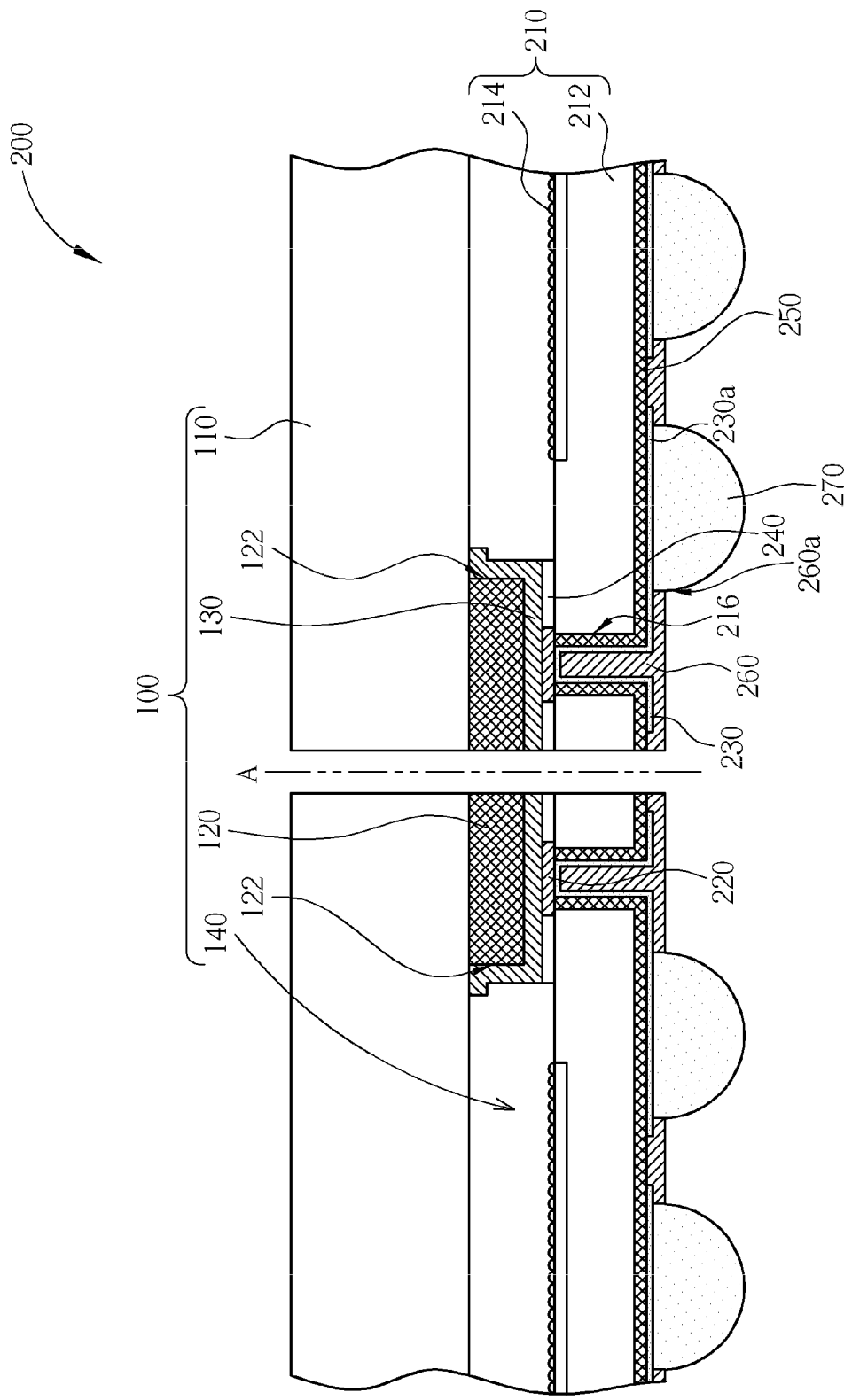
FIG. 1 is a schematic, cross-sectional diagram showing an image sensor package in accordance with one preferred embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

FIG. 1 is a schematic, cross-sectional diagram showing an image sensor package in accordance with one preferred embodiment of this invention. As shown in FIG. 1, generally, the image sensor package 200 is comprised of an optical cover plate 100 and an image sensor die 210. The image sensor die 210 comprises a semiconductor substrate 212, an image sensor device 214 on the active side of the semiconductor substrate 212, a bond pad 220 on the active side of the semiconductor substrate 212, a through-silicon via (TSV) structure 216 penetrating through of the semiconductor substrate 212, an insulating layer 250 on the backside of the semiconductor substrate 212, and a metal layer 230 on the insulating layer 250 for electrically connecting the bond pad 220. The metal layer 230 is conformally deposited in the TSV structure 216 and forms a re-distribution layer (RDL) including a solder pad pattern 230a on the backside of the semiconductor substrate 212. A solder mask 260 is formed on the metal layer 230 and the insulating layer 250. An opening 260a is provided in the solder mask 260 and exposes a portion of the solder pad pattern 230a. A solder ball 270 is disposed in the opening 260a. The incident light first penetrates the optical cover plate 100 and then reaches the image sensor die 210, which later transforms the light signal into digital signal, which is then outputted from the bond pad 220 and the metal layer 230.

According to the preferred embodiment of the invention, the optical cover plate 100 comprises a transparent substrate 110, an annular dam structure 120, and a barrier layer 130, wherein the annular dam structure 120 is disposed on the transparent substrate 110 and surrounds or encompasses a light-receiving region 140. The barrier layer 130 conformally covers the annular dam structure 120 and protects the annular dam structure 120. In this embodiment, the transparent substrate 110 may include, but not limited to, glass and quartz. The annular dam structure 120 may comprise epoxy resins, polyimide, photoresist or silicon-based materials. The barrier layer 130 may comprise aluminum, aluminum nitride, titanium, titanium nitride, tantalum, tantalum nitride, tungsten, titanium tungsten alloys, silver, gold, any combination thereof, or composite metal layer thereof. In another embodiment, the barrier layer 130 may comprise non-conductive layer or non-metal layer such as silicon oxide, silicon nitride, silicon oxynitride, silicon carbide, or any combination thereof. Further, it is understood that the annular dam structure 120 in this embodiment can be replaced with a plurality of annular dam structures in another embodiment, and the invention should not be limited to one single annular dam structure.

In addition, the barrier layer 130 of the optical cover plate 100 is bonded to the image sensor die 210 by using an adhesive layer 240. According to this embodiment, the barrier layer 130 can prevent moisture entry. After the wafer dicing process and the image sensor device 200 is singulated, as indicated with cutting line or dicing line A, moisture can be prevented from entering the light-receiving region 140 by way of the sidewall 122 of the annular dam structure 120.

As stated supra, the prior art dam structure is prone to peeling due to stress. The peeling may occur at the bonding interface between the dam structure and the bond pad, the bonding interface between the dam structure and the body, or the bonding interface between the dam structure and the transparent substrate. According to this embodiment, the barrier layer 130 is incorporated to cover a sidewall of the annular dam structure 120. The barrier layer 130 extends to a surface of the transparent substrate 110 and covers a perimeter of the light-receiving region 140. By doing so, moisture can be prevented from entering the light-receiving region 140. In addition, peeling off of the annular dam structure 120 due to stress can be avoided. Further, the barrier layer 130 is made of metal materials and has high degree of surface flatness such that less gaps or voids are formed at the bonding interface or joint. Therefore, the quality of package can be improved. Furthermore, the barrier layer 130 can act as a buffer layer for the annular dam structure 120 when subjected to changes in temperature. The barrier layer 130 can alleviate potential damage to the annular dam structure 120 due to temperature variation or thermal stress. Furthermore, the incorporation of the barrier layer 130 can improve the color cast phenomenon due to the green color of the annular dam structure 120.

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail. The following detailed description is, therefore, not to be taken in a limiting sense, and the scope of the present invention is defined only by the appended claims, along with the full scope of equivalents to which such claims are entitled. Further, it is to be understood that the optical cover plates described in some of the following embodiments may be replaced with the optical cover plate as set forth in FIG. 1 and may be combined with the image sensor die to constitute an image sensor package.

Figure 2:
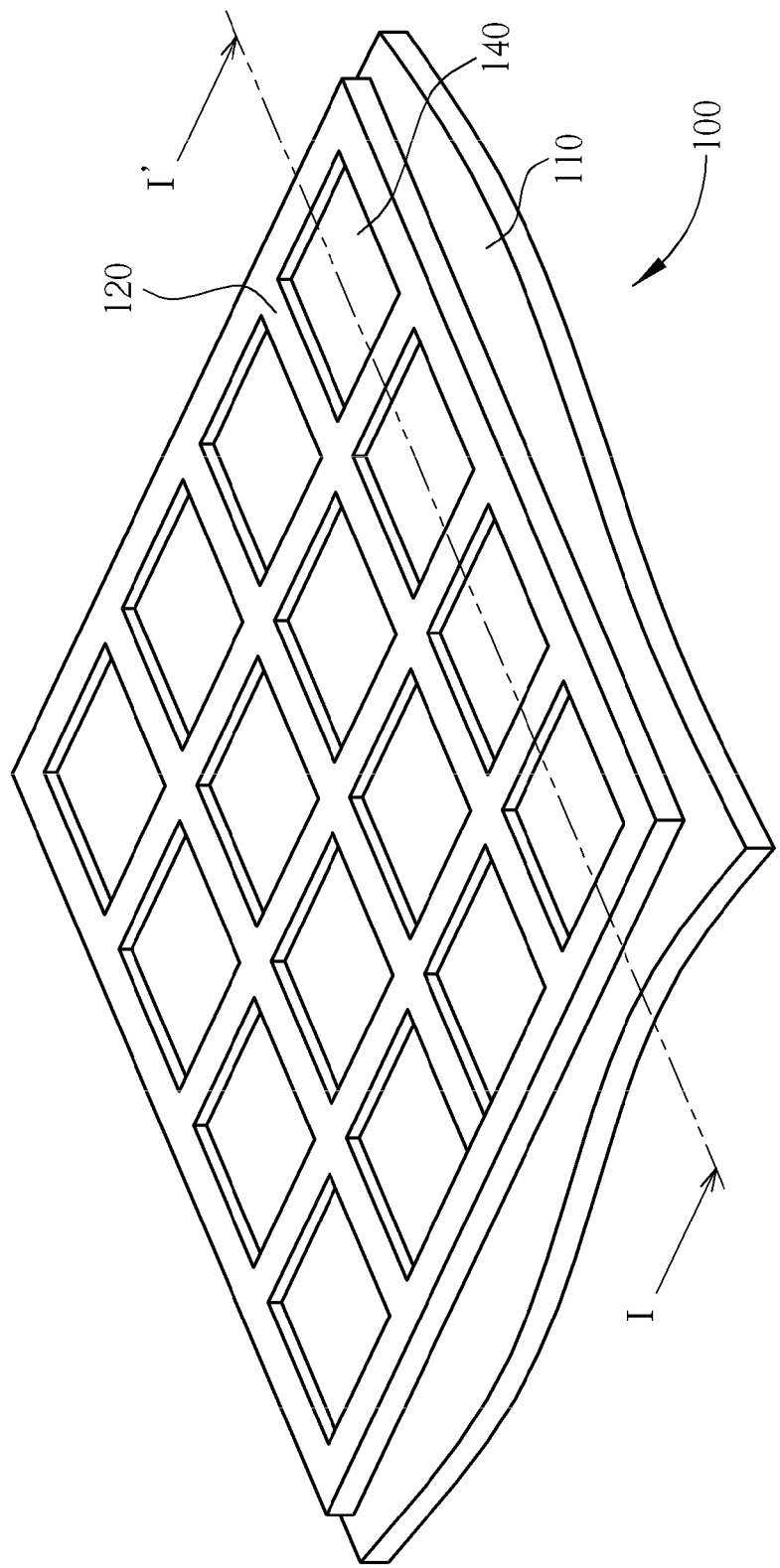
FIG. 2 is a perspective view of the optical cover plate in accordance with one preferred embodiment of this invention.
Figure 3:
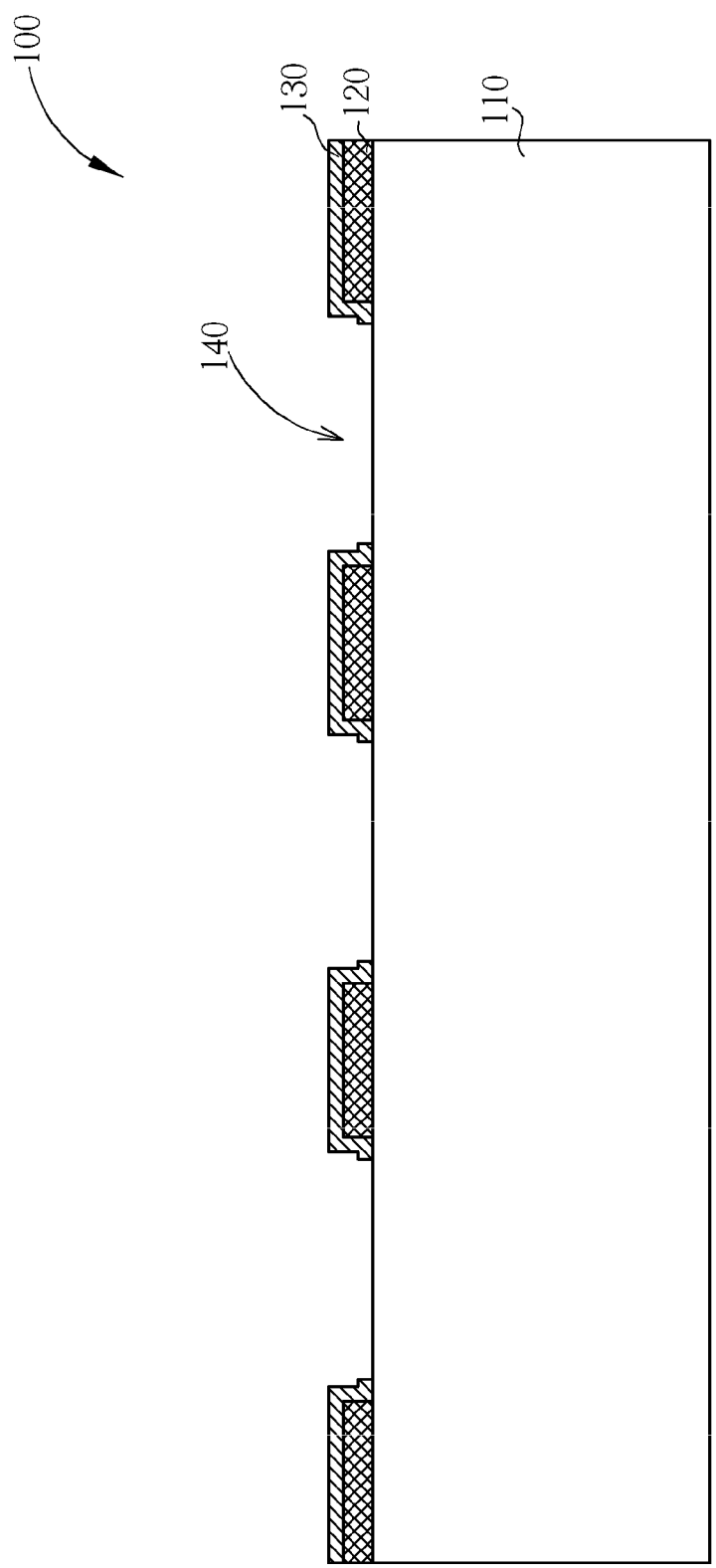
FIG. 3 is a cross-sectional view of the optical cover plate in the image sensor device taken along line I-I' of FIG. 2.

FIG. 2 is a perspective view of the optical cover plate in accordance with one preferred embodiment of this invention. FIG. 3 is a cross-sectional view of the optical cover plate in the image sensor device taken along line I-I' of FIG. 2. As shown in FIG. 2 and FIG. 3, the barrier layer 130 completely covers annular dam structure 120 including the top surface and sidewalls of the annular dam structure 120. The barrier layer 130 can slightly extend to the transparent substrate 110. This embodiment is similar to the optical cover plate 100 of the image sensor package 200 as set forth in FIG. 1, therefore details thereof is omitted.

Figure 4:
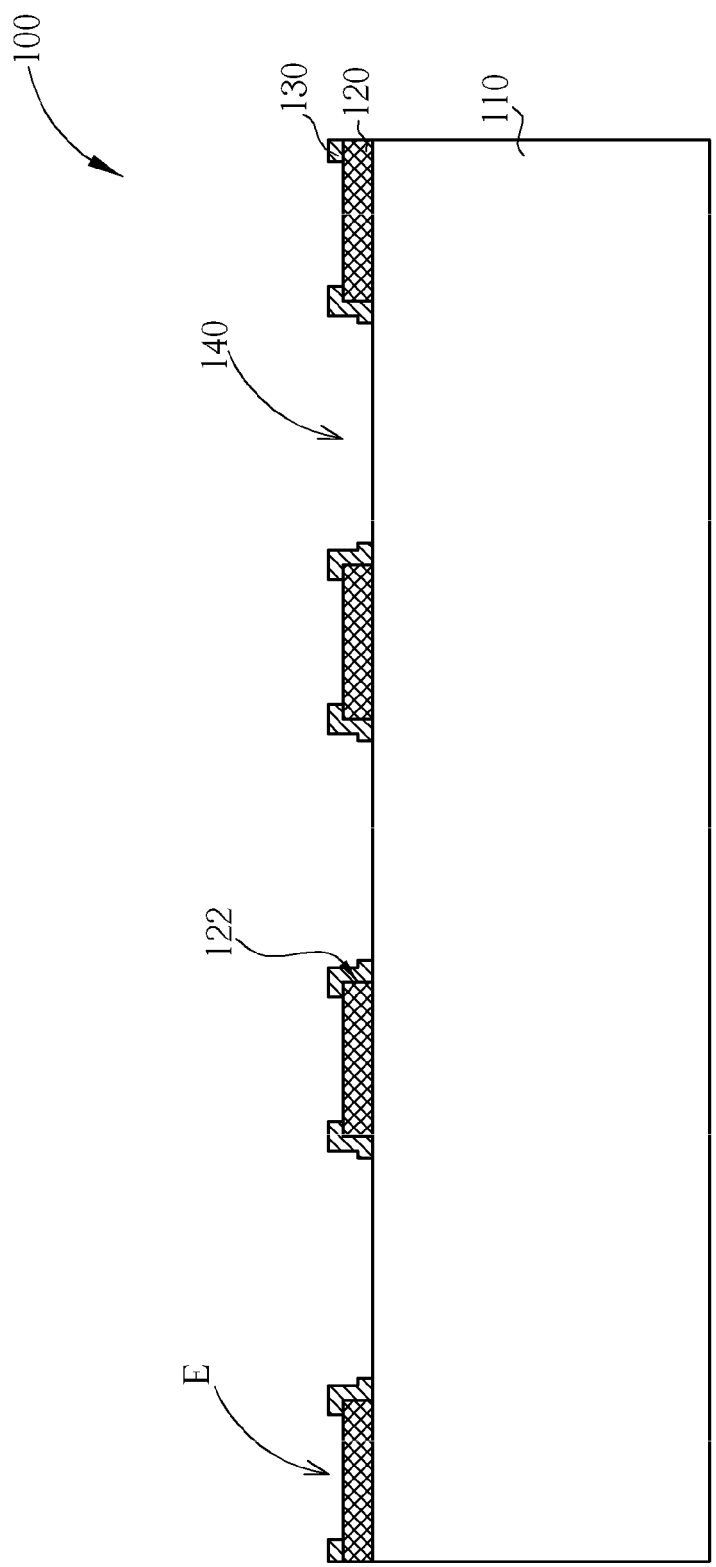
FIG. 4 is a schematic, cross-sectional diagram showing an optical cover plate in accordance with another preferred embodiment of this invention.

In another preferred embodiment of this invention, as shown in FIG. 4, the barrier layer 130 covers a top surface E of the annular dam structure 120. The barrier layer 130 is etched to expose a portion of the top surface E of the annular dam structure 120. By doing so, the barrier layer can cover a portion of the annular dam structure 120, particularly the sidewall 122 of the annular dam structure 120, thereby eliminating color cast problem and resolving stress, temperature or moisture issues. In one aspect, the annular dam structure 120 is bonded to the image sensor die 210 (FIG. 1) using the adhesive layer 240 (FIG. 1) with better adhesion than the barrier layer 130. The exposed annular dam structure 120 can directly contact with the adhesive layer 240, thereby achieving better bonding quality.

Figure 5:
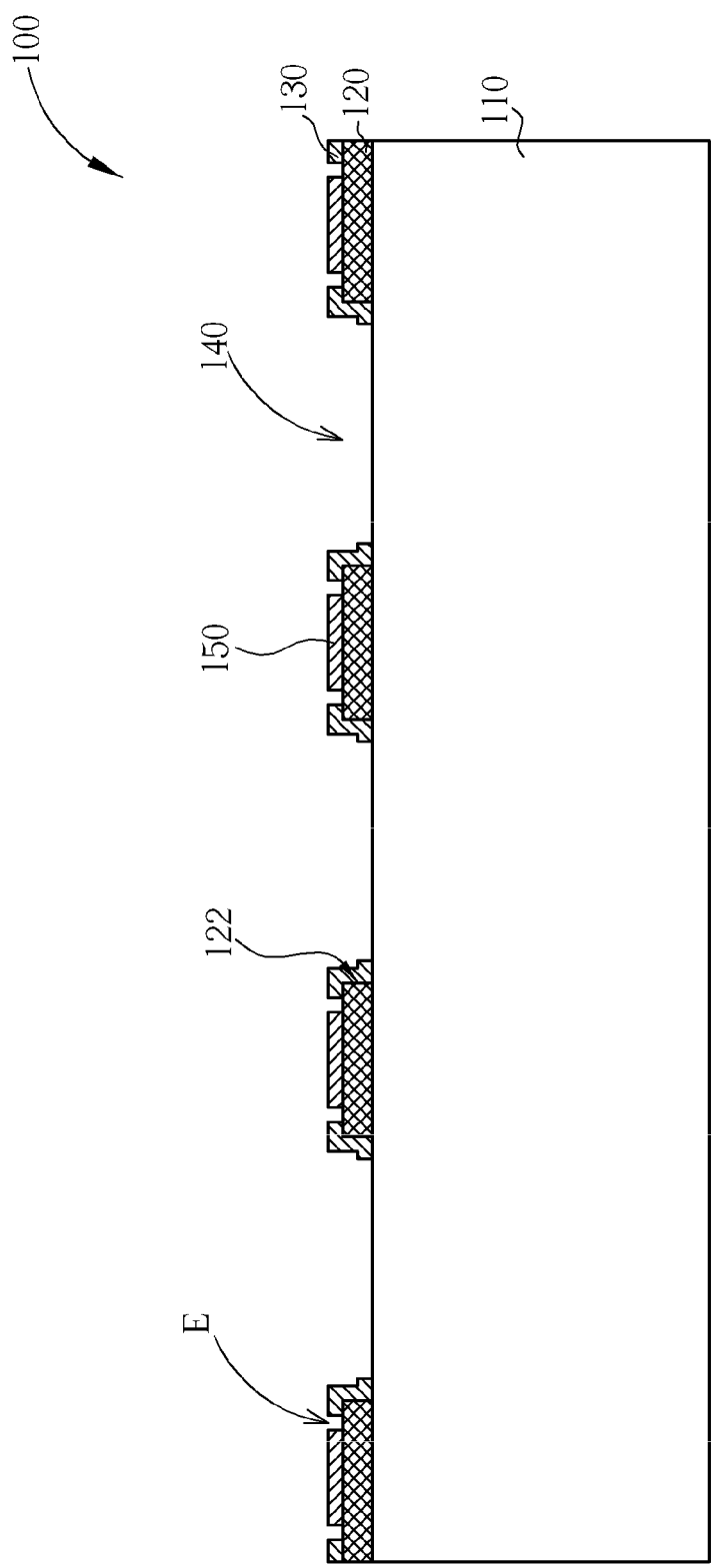
FIG. 5 is a schematic, cross-sectional diagram showing an optical cover plate in accordance with still another preferred embodiment of this invention.

According to still another preferred embodiment, as shown in FIG. 5, a supporting pattern 150 is disposed on the light-exposed top surface E of the annular dam structure 120. The supporting pattern 150 may be composed of a metal layer or a non-metal layer. Typically, the bond pad 220 (FIG. 1) is made of solid-state metal materials, while the annular dam structure 120 is made of dielectric materials. In a relatively high temperature environment, some of the dielectric material may be partially liquidized form. In such case, the bond pad 220 cannot be accurately fixed in the predetermined position of the annular dam structure 120. In this embodiment, bond pad 220 is aligned with the supporting pattern 150 and by providing the supporting pattern 150 on the annular dam structure 120, the above-described problem can be avoided.

Figure 6:
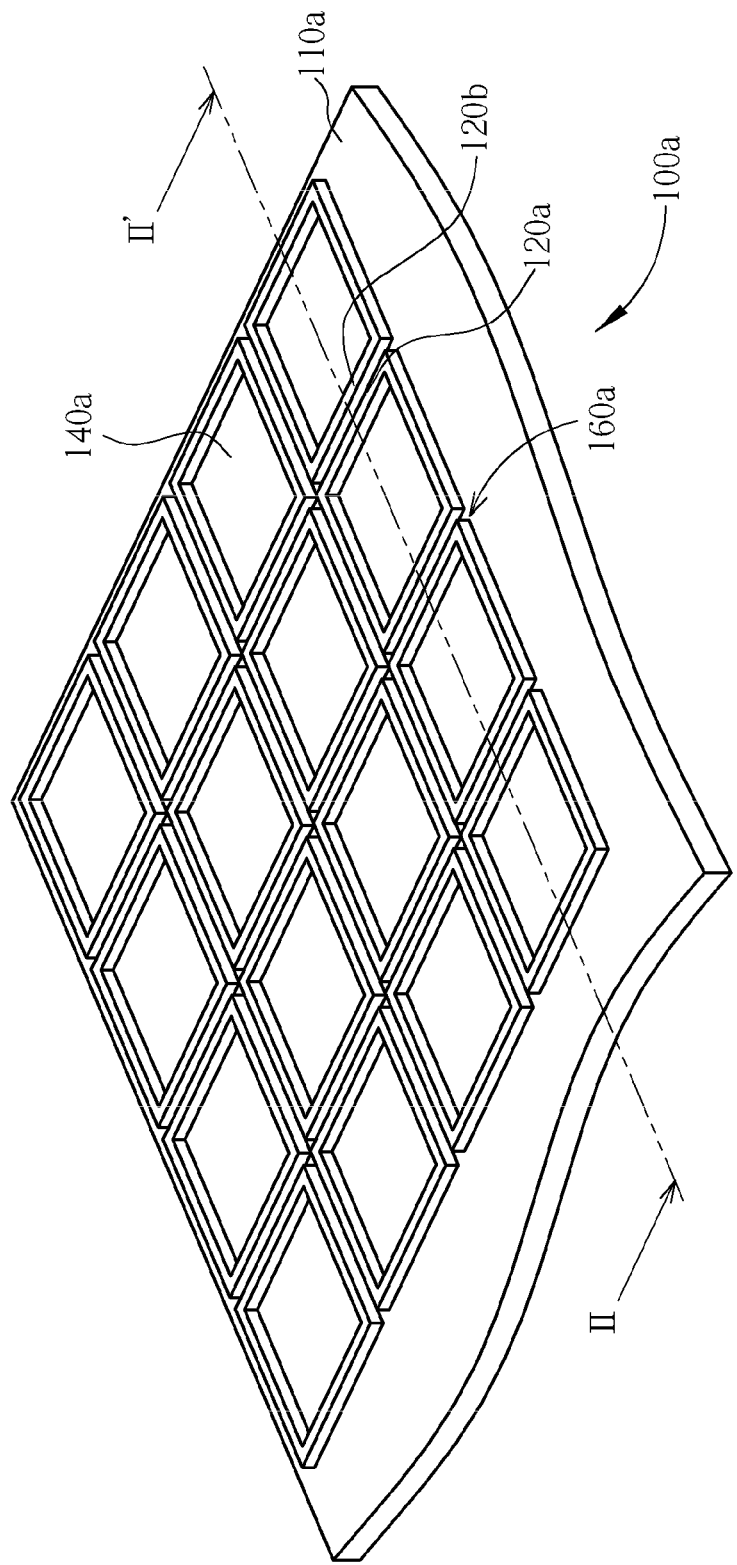
FIG. 6 is a perspective view of the optical cover plate in accordance with still another preferred embodiment of this invention.
Figure 7:
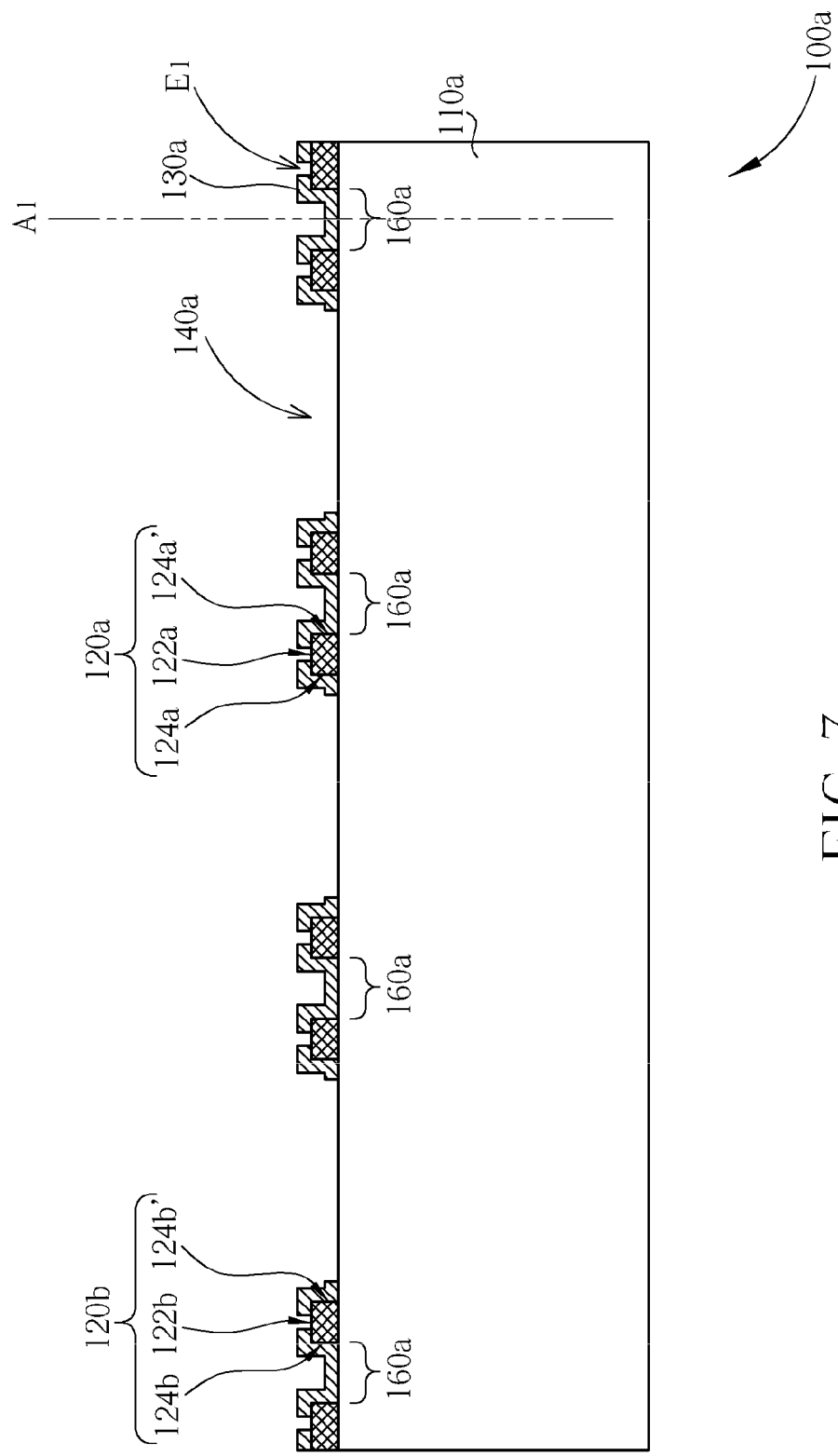
FIG. 7 is a cross-sectional view of the optical cover plate taken along line II-II' of FIG. 6.

FIG. 6 is a perspective view of the optical cover plate in accordance with still another preferred embodiment of this invention. FIG. 7 is a cross-sectional view of the optical cover plate taken along line II-II' of FIG. 6. As shown in FIG. 6 and FIG. 7, the optical cover plate 100a comprises a transparent substrate 110a, a first dam structure 120a, a second dam structure 120b, a barrier layer 130a and a dicing region 160a. The first dam structure 120a and the second dam structure 120b are disposed on the transparent substrate 110a and the second dam structure 120b is in close proximity to the first dam structure 120a. The first dam structure 120a comprises a first top surface 122a and two opposite first sidewalls 124a and 124a'. The second dam structure 120b comprises a second top surface 122b and two opposite second sidewalls 124b and 124b'. The dicing region 160a is located between the first dam structure 120a and the second dam structure 120b. The barrier layer 130a covers the first dam structure 120a and the second dam structure 120b. The barrier layer 130a conformally covers the first sidewalls 124a and 124a' of the first dam structure 120a, the transparent substrate 110a within the dicing region 160a, and the second sidewalls 124b and 124b' of the second dam structure 120b. By covering the sidewalls of the first dam structure 120a and the second dam structure 120b with the barrier layer, exposure of the sidewalls of the first dam structure 120a and the second dam structure 120b to the atmosphere can prevented when the optical cover plate 100a is cut along the cutting line or scribe line A1. Compared to the embodiment set forth in FIG. 5, this embodiment provides better moisture proof ability and improved resistance to influence of the stress and temperature variation.

According to this embodiment, the transparent substrate 110a may be made of glass or quartz. The first dam structure 120a and the second dam structure 120b may be composed of epoxy resins, polyimide, photoresist or silicon-based materials. The barrier layer 130a may comprise aluminum, aluminum nitride, titanium, titanium nitride, tantalum, tantalum nitride, tungsten, titanium tungsten alloys, silver, gold, or composite metal layer thereof. In another embodiment, the barrier layer 130a may comprise non-conductive layer such as silicon oxide, silicon nitride, silicon oxynitride, silicon carbide, or any combination thereof. Alternatively, in this embodiment, a supporting pattern (not shown) may be added on the top surface E1 to further fix the accurate bonding position of the bond pad 220.

Figure 8A:
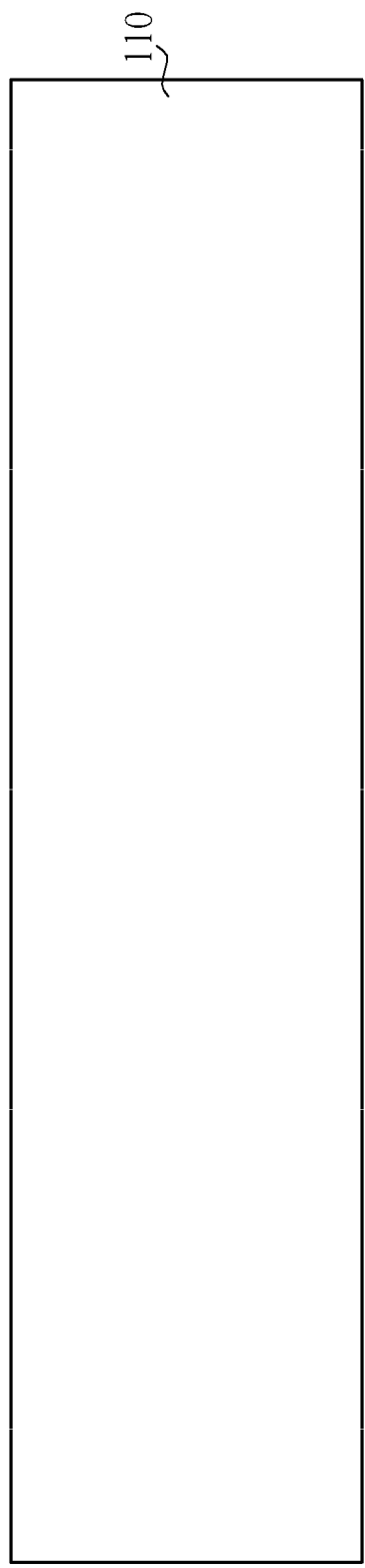
FIG. 8A to FIG. 8D demonstrate an exemplary process flow of fabricating the optical cover plate in FIG. 3 according to the invention.
Figure 8B:
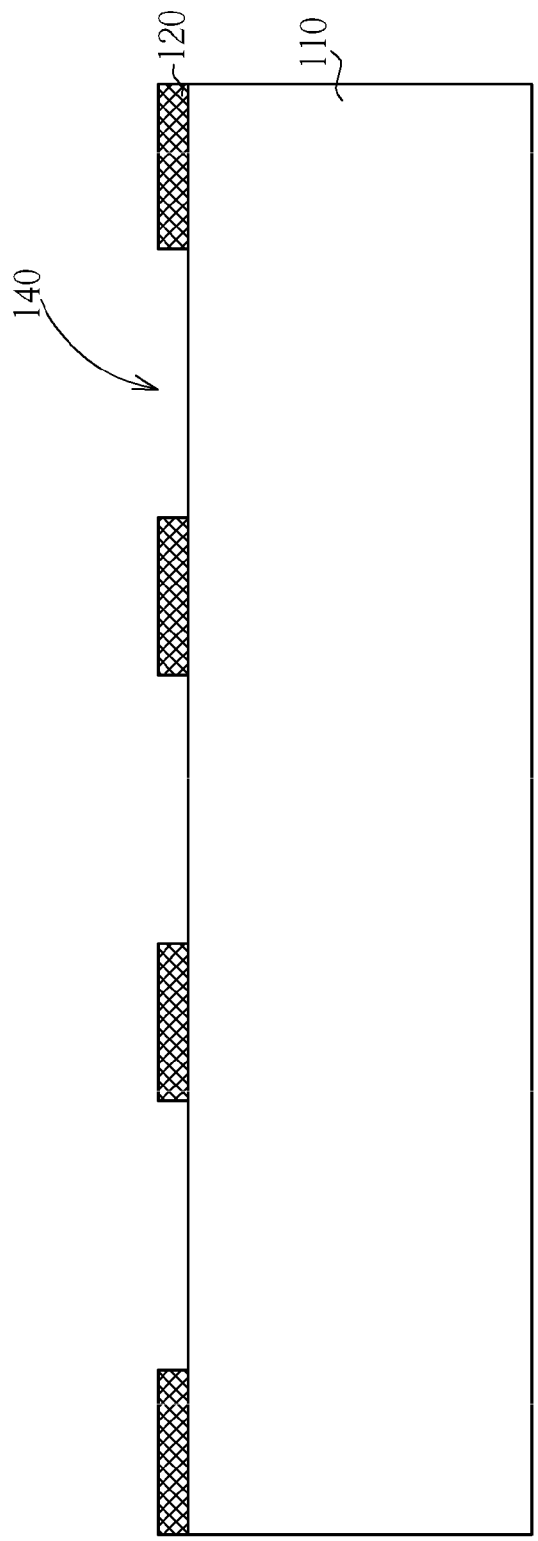
Figure 8C:
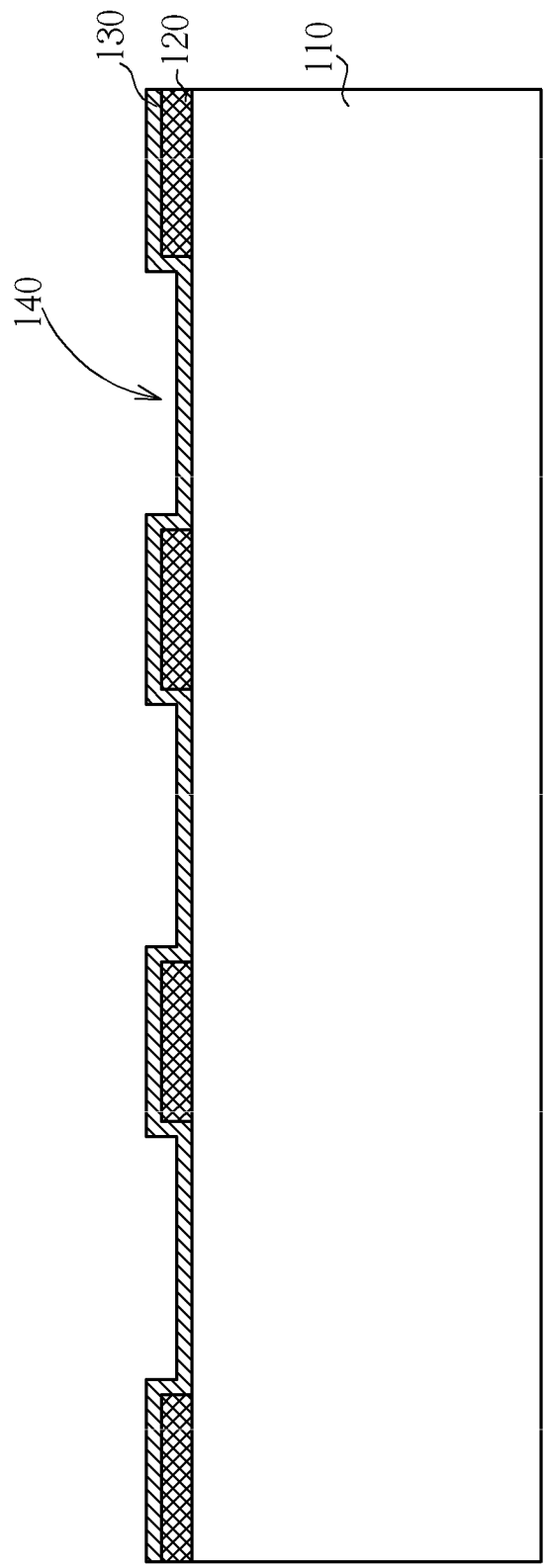
Figure 8D:
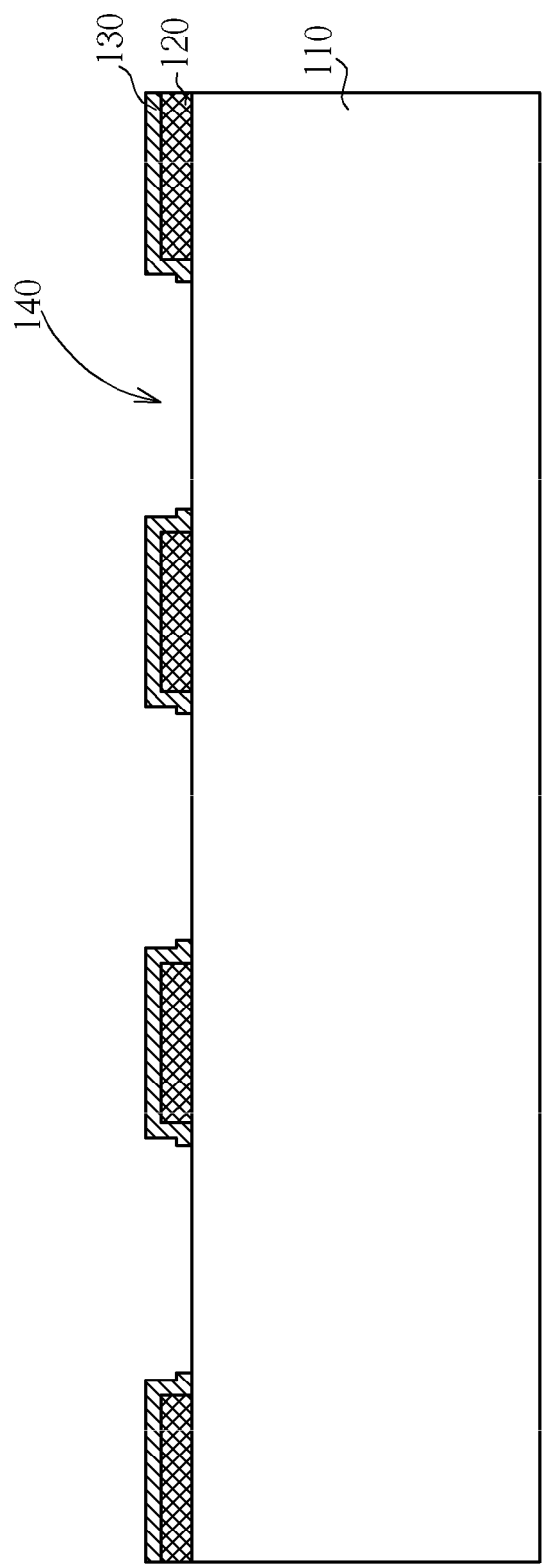

FIG. 8A to FIG. 8D demonstrate an exemplary process flow of fabricating the optical cover plate in FIG. 3 according to the invention. First, a transparent substrate 110 is provided, as shown in FIG. 8A. An annular dam structure 120 is formed on the transparent substrate 110, as shown in FIG. 8B. Subsequently, a conformal barrier layer 130 is sputter coated or deposited on the dam structure 120, as shown in FIG. 8C. A pattern transferring process is then performed to remove the barrier layer 130 from the light-receiving region 140, as shown in FIG. 8D. The aforesaid pattern transferring process may involve the use of a patterned photoresist (not shown) such as plated photoresist, which conformally covers the barrier layer 130. The barrier layer 130 not covered by the patterned photoresist is then removed from the light-receiving region 140. In addition, the barrier layer 130 on the top surface E of the annular dam structure 120 may be etched away concurrently to expose the dam structure 120, thereby obtaining the structure as set forth in FIG. 4. Further, a supporting pattern 150 may be disposed on the dam structure 120 to obtain the structure as set forth in FIG. 5. It is understood the structure in FIG. 6 may be obtained by similar process steps and therefore details are omitted.

Figure 9A:
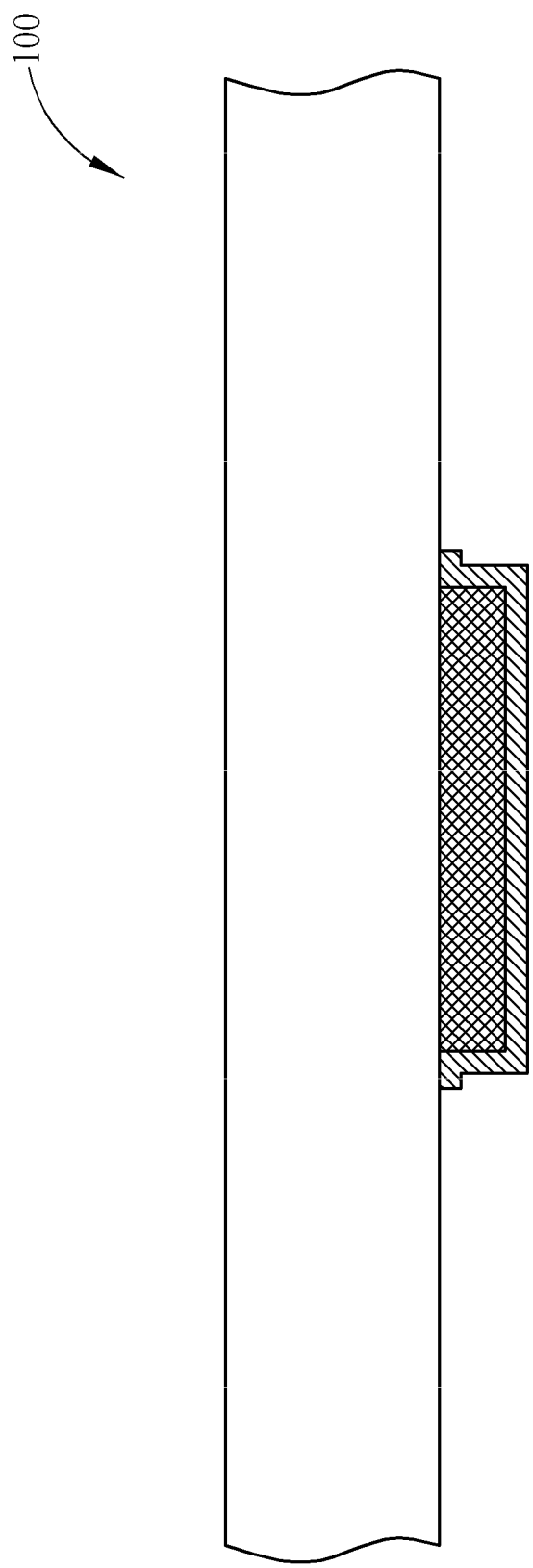
FIG. 9A to FIG. 9H are schematic, cross-sectional diagrams showing a method for fabricating an image sensor package in FIG. 1 according to the invention.
Figure 9B:
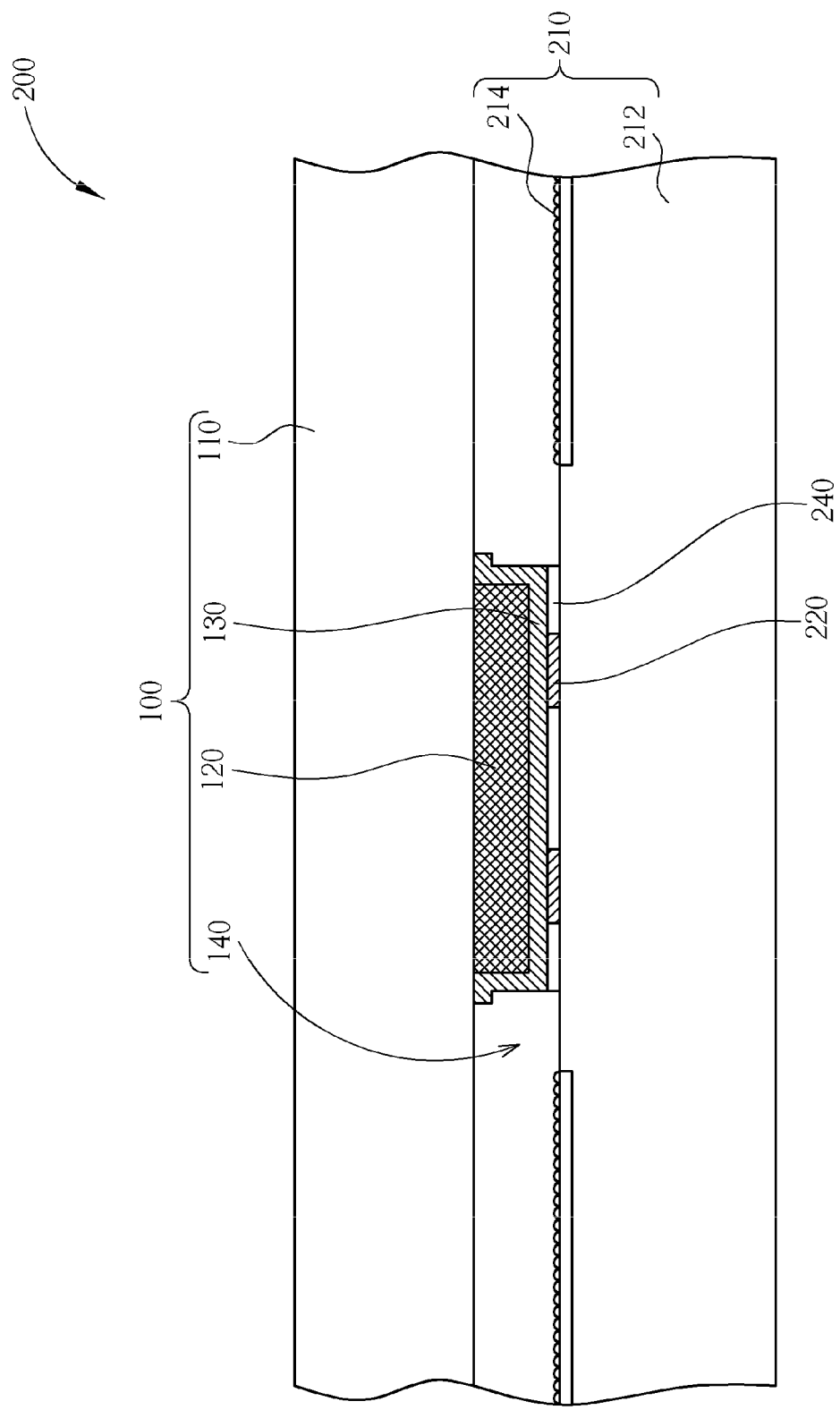
Figure 9C:
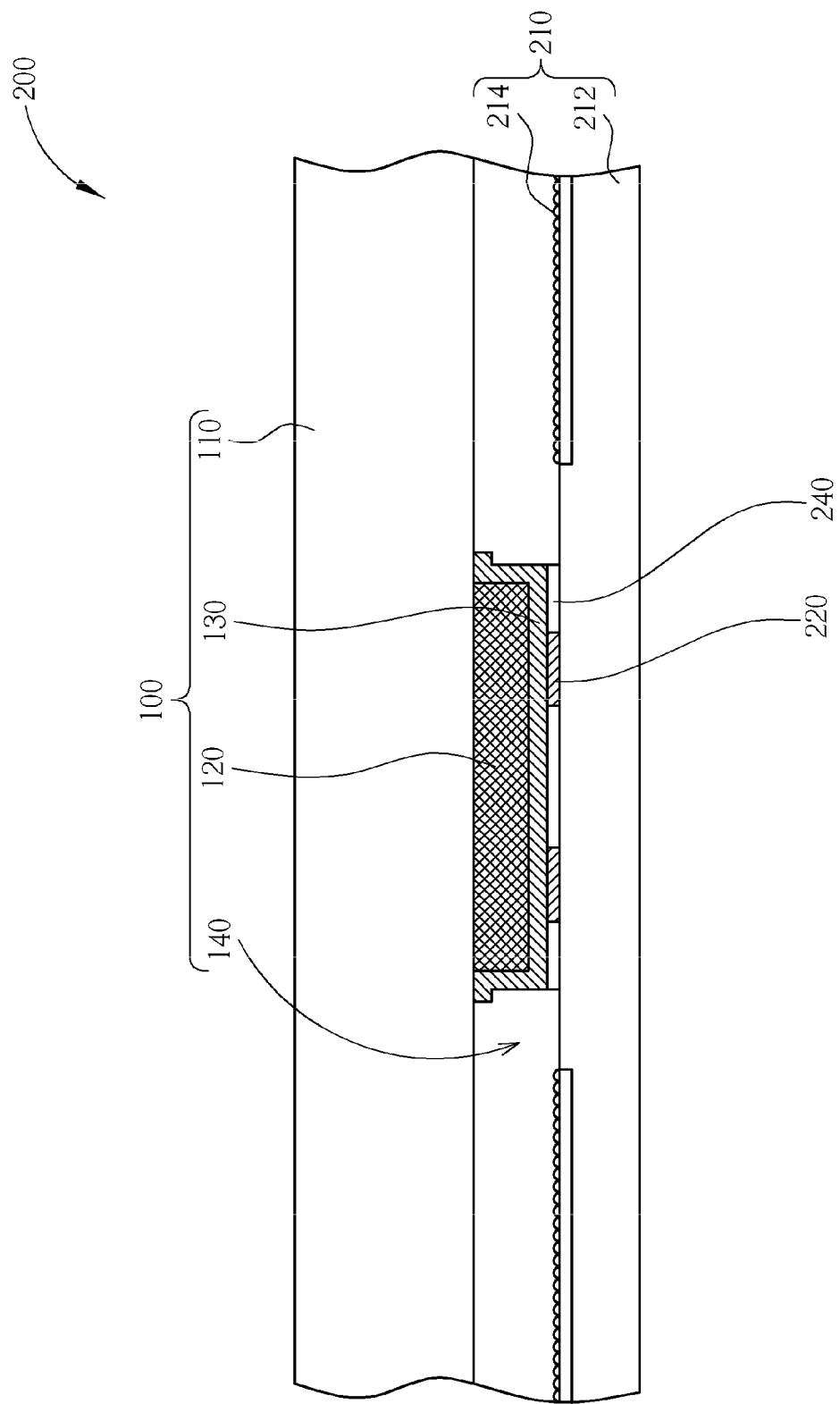
Figure 9D:
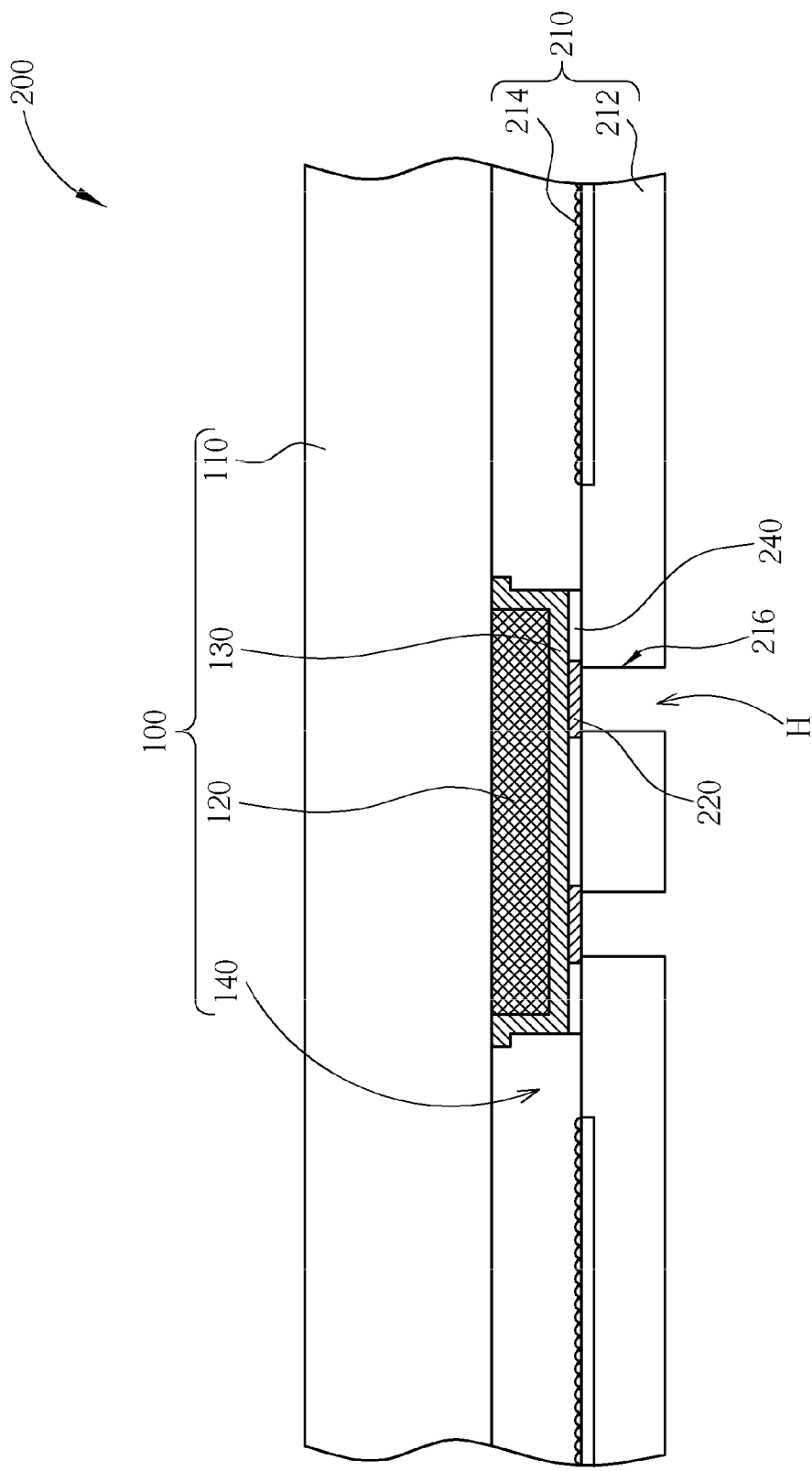
Figure 9E:
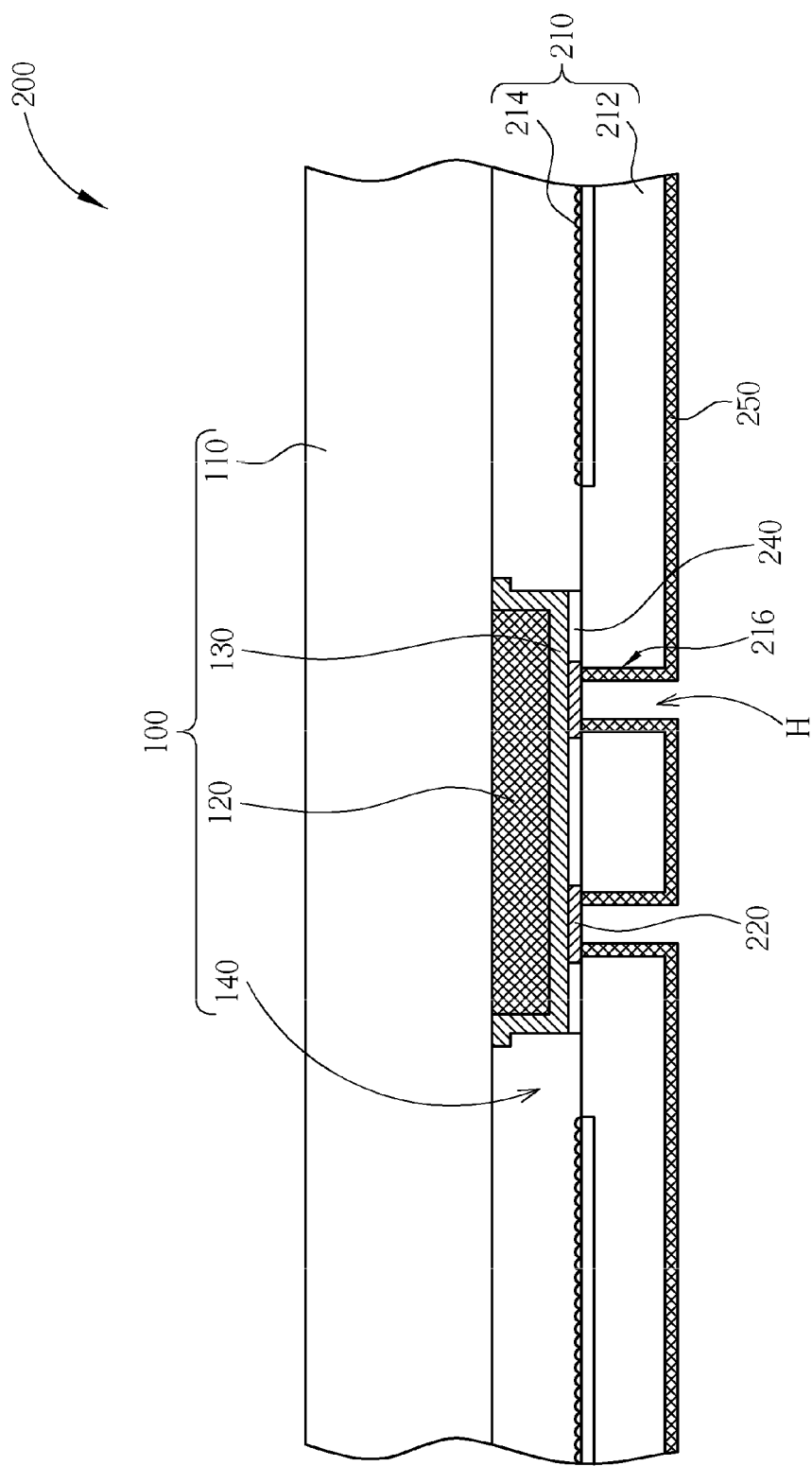
Figure 9F:
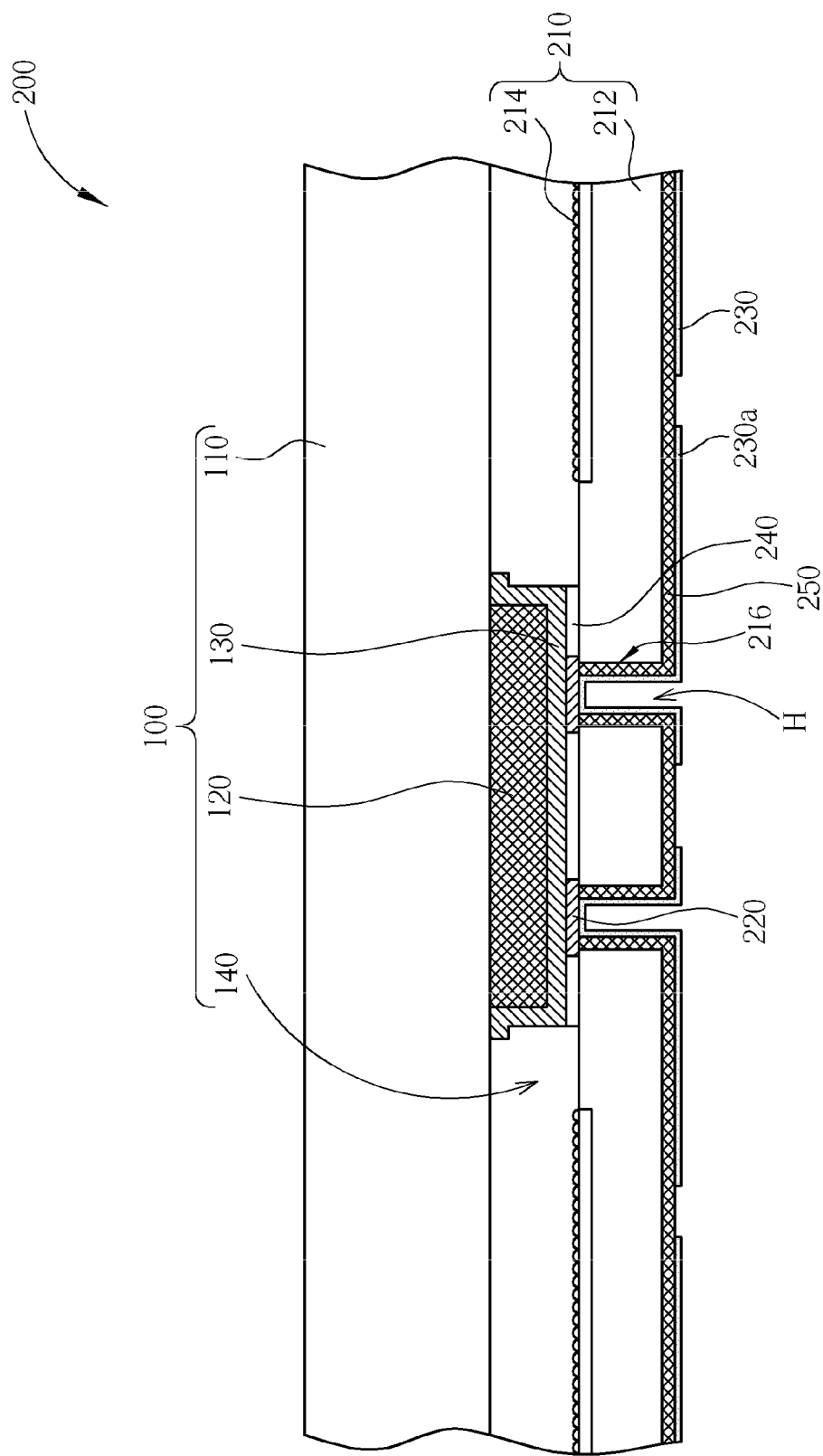
Figure 9G:
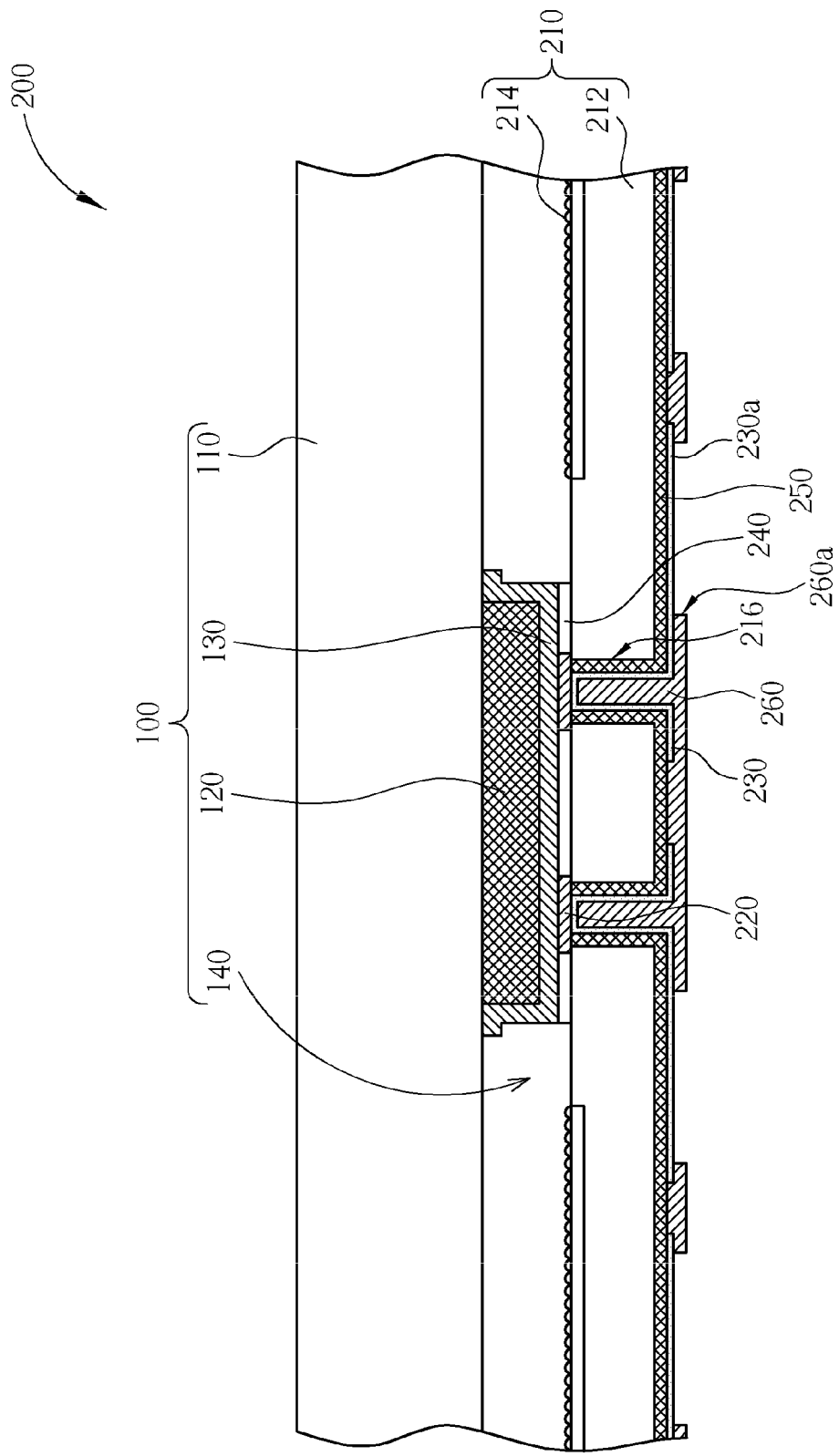
Figure 9H:
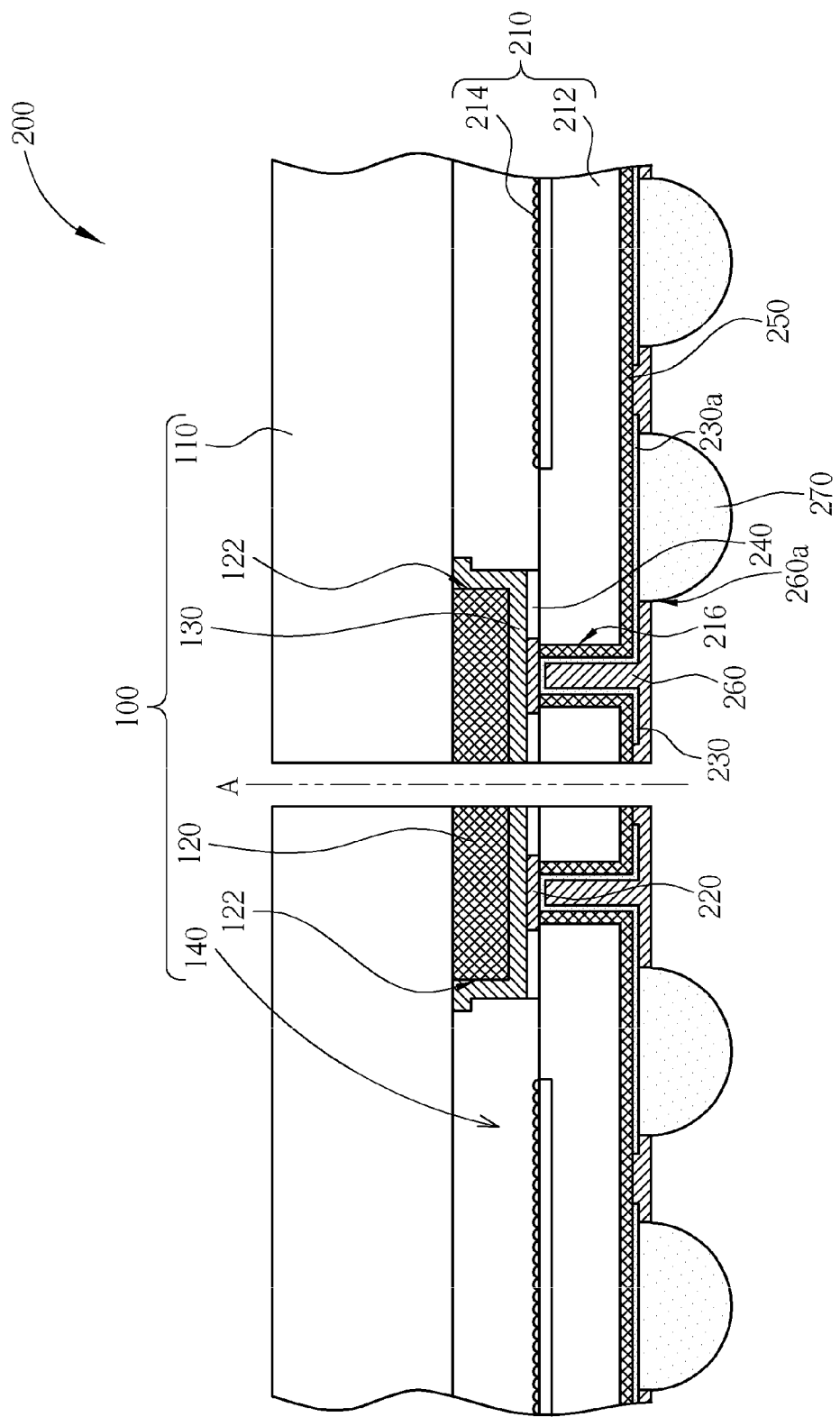

FIG. 9A to FIG. 9H are schematic, cross-sectional diagrams showing a method for fabricating an image sensor package in FIG. 1 according to the invention. First, an optical cover plate 100 such as the after-etch optical cover plate in FIG. 8D is provided, as shown in FIG. 9A. The optical cover plate 100 is then bonded to a image sensor die 210, as shown in FIG. 9B. Thereafter, a wafer backside grinding or etching process is carried out to thin the backside of the semiconductor substrate 212, as shown in FIG. 9C. Subsequently, a pattern transferring process is performed to form an opening H on the backside of the semiconductor substrate 212, thereby exposing a portion of the bond pad 220, as shown in FIG. 9D. An insulating layer 250 is then deposited on the semiconductor substrate 212 to isolate the semiconductor substrate 212. A portion of the insulating layer 250 is removed to expose the bond pad 220, as shown in FIG. 9E. Subsequently, a metal layer 230 is coated on the insulating layer 250 and is electrically connected to the bond pad 220, as shown in FIG. 9F. A solder mask 260 is then formed to cover the metal layer 230 and the insulating layer 250, as shown in FIG. 9G. At least a solder opening 260a is provided in the solder mask 260. Finally, at least a solder ball 270 is formed on the exposed metal layer 230, as shown in FIG. 9H. The solder ball 270 electrically connects the image sensor package 200 to other electronic components (not shown) such as a printed circuit board or a second chip or die.

To sum up, the invention image sensor package and the inventive optical cover plate incorporate a barrier layer on the dam structure, which is capable of resolving color cast problem due to the nature and green color of the dam structure itself. More importantly, the barrier layer also covers the perimeter of the light-receiving region. By providing such configuration, moisture can be prevented form entering the light-receiving region by way of the annular dam structure. The barrier layer also improves the bonding interface between the annular dam structure and the transparent substrate, the bond pad or the semiconductor substrate. The invention also resolves the peeling problem due to temperature or thermal stress. The invention also provides a method for fabricating the image sensor package and the inventive optical cover plate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical cover plate for packaging, comprising:
   a transparent substrate;
   at least one annular dam structure disposed on said transparent substrate, wherein said annular dam structure has a hollow area to expose a surface of said transparent substrate, and said annular dam structure being made of an insulating material, and said annular dam structure and said transparent substrate are made of different materials; and
   a barrier layer completely covering a surface of said annular dam structure facing away from said transparent substrate, and at least two sidewalls of said annular dam structure facing said hollow area, and extending to directly cover at least a portion of said surface of said transparent substrate, such that said barrier layer presents a step shape, wherein said hollow area is only partially filled by said barrier layer, and said annular dam structure is present between the barrier layer and the transparent substrate.

2. The optical cover plate for packaging according to claim 1, wherein said annular dam structure is composed of epoxy resins, polyimide, photoresist or silicon-based materials.

3. The optical cover plate for packaging according to claim 1, wherein said barrier layer is a metal layer.

4. The optical cover plate for packaging according to claim 3, wherein said metal layer comprises aluminum, aluminum nitride, titanium, titanium nitride, tantalum, tantalum nitride, tungsten, titanium tungsten alloys, silver, gold, or any combination thereof.

5. The optical cover plate for packaging according to claim 1, wherein said barrier layer is a non-metal layer.

6. The optical cover plate for packaging according to claim 5, wherein said non-metal layer comprises silicon oxide, silicon nitride, silicon oxynitride, silicon carbide, or any combination thereof.

7. The optical cover plate for packaging according to claim 1, wherein said barrier layer extends to at least a top surface of said annular dam structure.

8. The optical cover plate for packaging according to claim 7, wherein a supporting pattern is disposed on said top surface of said annular dam structure.

9. The optical cover plate for packaging according to claim 1, wherein said annular dam structure encompasses a light-receiving region on said transparent substrate, and said barrier layer extends to said transparent substrate and covers perimeter of said light-receiving region.

10. The optical cover plate for packaging according to claim 9, wherein said barrier layer completely covers at least two sidewalls of said annular dam structure to form a means for preventing moisture from entering said light-receiving region.

11. The optical cover plate for packaging according to claim 9, wherein the annular dam structure is a continuous structure having a continuous wall encompassing the light-receiving region.

12. The optical cover plate for packaging according to claim 1, wherein said transparent substrate comprises glass or quartz.

13. The optical cover plate for packaging according to claim 1, wherein said barrier layer completely covers at least two sidewalls of said annular dam structure to form a means for removing color cast that stems from green color of said annular dam structure.

14. A method for fabricating an optical cover plate, comprising:
   providing a transparent substrate;
   forming at least one annular dam structure on said transparent substrate, wherein said annular dam structure has a hollow area to expose a surface of said transparent substrate, and said dam structure is made of an insulating material, and said annular dam structure and said transparent substrate are made of different materials; and
   forming a barrier layer completely covering a surface of said annular dam structure facing away from said transparent substrate, and at least two sidewalls of said annular dam structure facing said hollow area, wherein the barrier layer extends to directly cover at least a portion of said surface of said transparent substrate, such that said barrier layer presents a step shape, wherein said hollow area is only partially filled by said barrier layer, and said annular dam structure is present between the barrier layer and the transparent substrate.

15. The method for fabricating an optical cover plate according to claim 14, wherein said annular dam structure is composed of epoxy resins, polyimide, photoresist or silicon-based materials.

16. The method for fabricating an optical cover plate according to claim 14, wherein said barrier layer is a metal layer.

17. The method for fabricating an optical cover plate according to claim 16, wherein said metal layer comprises aluminum, aluminum nitride, titanium, titanium nitride, tantalum, tantalum nitride, tungsten, titanium tungsten alloys, silver, gold, or any combination thereof.

18. The method for fabricating an optical cover plate according to claim 14, wherein said barrier layer is a non-metal layer.

19. The method for fabricating an optical cover plate according to claim 18, wherein said non-metal layer comprises silicon oxide, silicon nitride, silicon oxynitride, silicon carbide, or any combination thereof.

20. The method for fabricating an optical cover plate according to claim 14, wherein said annular dam structure encompasses a light-receiving region on said transparent substrate, and said light-receiving region is exposed by performing an etching process to remove said barrier layer formed on said light-receiving region, the method further comprises: performing an etching process to remove said barrier layer from a top surface of said annular dam structure to expose a portion of said annular dam structure.

21. The method for fabricating an optical cover plate according to claim 20, wherein after exposing the portion of said annular dam structure, the method further comprises: forming a supporting pattern on the exposed portion of said annular dam structure.

22. The method for fabricating an optical cover plate according to claim 20, wherein the annular dam structure is a continuous structure having a continuous wall encompassing the light-receiving region.

23. A chip package, comprising:
a transparent substrate;
a semiconductor substrate;
at least one annular dam structure having a hollow area and disposed between said transparent substrate and said semiconductor substrate to define a cavity therebetween, wherein a surface of said transparent substrate is exposed through said hollow area, and said annular dam structure is a closed structure surrounding said cavity therebetween; said annular dam structure and said transparent substrate are made of different materials;
an image sensor device disposed in said cavity; and
a barrier layer completely covering a surface of said annular dam structure facing away from said transparent substrate, and at least two sidewalls of said annular dam structure without completely filling said cavity facing said cavity, and extending to directly cover at least a portion of said surface of said transparent substrate, such that said barrier layer presents a step shape, wherein a portion of said cavity not filled by the barrier layer exposes said image sensor device, and said annular dam structure is present between the barrier layer and the transparent substrate.

24. An optical cover plate for packaging, comprising:
a transparent substrate;
a semiconductor substrate;
at least one annular dam structure having a hollow area and disposed between said transparent substrate and said semiconductor substrate to define a cavity therebetween, wherein a surface of said transparent substrate is exposed through said hollow area, and said annular dam structure surrounds said cavity and is made of an insulating material, and said annular dam structure and said transparent substrate are made of different materials;
an image sensor device disposed in said cavity;
a barrier layer completely covering a surface of said annular dam structure facing away from said transparent substrate, and at least two sidewalls of said annular dam structure facing said cavity, and extending to directly cover at least a portion of said surface of said transparent substrate, such that said barrier layer presents a step shape, wherein said annular dam structure is present between the barrier layer and the transparent substrate; and
a bond pad disposed between said annular dam structure and said semiconductor substrate, wherein said bond pad being electrically connected to said image sensor device in said cavity.

* * * * *